United States Patent
Hsieh et al.

(10) Patent No.: US 9,671,898 B2
(45) Date of Patent: *Jun. 6, 2017

(54) INPUT DEVICE WITH FORCE SENSING

(71) Applicant: Synaptics Incorporated, San Jose, CA (US)

(72) Inventors: Lin-Hsiang Hsieh, Taoyuan (TW); Richard Schediwy, Union City, CA (US)

(73) Assignee: Synaptics Incorporated, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/694,961

(22) Filed: Apr. 23, 2015

(65) Prior Publication Data

US 2015/0227256 A1 Aug. 13, 2015

Related U.S. Application Data

(63) Continuation of application No. 13/316,279, filed on Dec. 9, 2011, now Pat. No. 9,041,418.

(Continued)

(51) Int. Cl.
*G01R 27/26* (2006.01)
*G06F 3/041* (2006.01)
(Continued)

(52) U.S. Cl.
CPC ............ *G06F 3/0416* (2013.01); *G06F 3/016* (2013.01); *G06F 3/044* (2013.01); *G06F 3/0414* (2013.01);
(Continued)

(58) Field of Classification Search
CPC ........ G06F 3/044; G06F 3/045; G06F 3/0488; G06F 3/04883; G06F 3/07886;
(Continued)

(56) References Cited

U.S. PATENT DOCUMENTS 4,290,052 A 9/1981 Eichelberger et al.
4,719,538 A 1/1988 Cox
(Continued)

FOREIGN PATENT DOCUMENTS

JP H07-280671 A 10/1995
JP 2009009249 A 1/2009
(Continued)

OTHER PUBLICATIONS

International Preliminary Report on Patentability issued in PCT/US2012/052909 dated Mar. 25, 2014 (5 pages).
(Continued)

*Primary Examiner* — Thang Le
(74) *Attorney, Agent, or Firm* — Osha Liang LLP

(57) ABSTRACT

Devices and methods are provided that facilitate improved input device performance. The devices and methods utilize a first substrate with proximity sensor electrodes and at least a first force sensor electrode disposed on the first substrate. A second substrate is physically coupled to the first substrate, where the second substrate comprises a spring feature and an electrode component. The electrode component at least partially overlaps the first force sensor electrode to define a variable capacitance between the first force sensor electrode and the electrode component. The spring feature is configured to facilitate deflection of the electrode component relative to the first force sensor electrode to change the variable capacitance. A measure of the variable capacitance may be calculated and used to determine force information regarding the force biasing the input device.

21 Claims, 7 Drawing Sheets

Related U.S. Application Data

(60) Provisional application No. 61/551,346, filed on Oct. 25, 2011.

(51) Int. Cl.
   *G06F 3/044* (2006.01)
   *H03K 17/975* (2006.01)
   *G06F 3/01* (2006.01)

(52) U.S. Cl.
   CPC . *H03K 17/975* (2013.01); *G06F 2203/04101* (2013.01); *G06F 2203/04103* (2013.01); *G06F 2203/04105* (2013.01); *Y10T 29/49126* (2015.01)

(58) Field of Classification Search
   CPC .... G06F 3/0412; G06F 3/0414; G06F 3/0416; G01R 27/2605; G01D 5/24; G01D 5/2415; G01D 5/2412; G01D 5/2417; H01H 11/005; H01H 11/0056; H01L 2924/01079; H01L 2924/01078
   USPC .............. 324/658–661, 686, 688, 750.17; 345/173, 174
   See application file for complete search history.

(56) References Cited

U.S. PATENT DOCUMENTS

| | | | |
|---|---|---|---|
| 5,492,020 A * | 2/1996 | Okada | G01L 5/165 73/1.08 |
| 5,510,813 A | 4/1996 | Makinwa et al. | |
| 5,854,625 A | 12/1998 | Frisch et al. | |
| 5,942,733 A | 8/1999 | Allen et al. | |
| 5,945,890 A | 8/1999 | McCorkle | |
| 5,973,668 A | 10/1999 | Watanabe | |
| 6,002,389 A | 12/1999 | Kasser | |
| 6,642,857 B1 | 11/2003 | Schediwy et al. | |
| 6,888,537 B2 | 5/2005 | Benson et al. | |
| 6,958,614 B2 | 10/2005 | Morimoto | |
| 7,047,818 B2 | 5/2006 | Dallenbach et al. | |
| 7,148,882 B2 | 12/2006 | Kamrath et al. | |
| 7,196,694 B2 | 3/2007 | Roberts | |
| 7,398,587 B2 | 7/2008 | Morimoto | |
| 7,451,659 B2 | 11/2008 | Dallenbach et al. | |
| 7,499,040 B2 | 3/2009 | Zadesky et al. | |
| 7,656,465 B2 | 2/2010 | Takeda et al. | |
| 7,728,487 B2 | 6/2010 | Adachi et al. | |
| 7,743,667 B2 | 6/2010 | Harish et al. | |
| 7,784,366 B2 | 8/2010 | Daverman et al. | |
| 7,786,655 B2 | 8/2010 | Park et al. | |
| 7,903,091 B2 | 3/2011 | Lee et al. | |
| 8,120,229 B2 | 2/2012 | Huang | |
| 8,169,416 B2 | 5/2012 | Han | |
| 8,570,297 B2 | 10/2013 | Bulea et al. | |
| 8,698,769 B2 | 4/2014 | Coulson et al. | |
| 2002/0019711 A1 | 2/2002 | Miyashita et al. | |
| 2002/0109137 A1 * | 8/2002 | Sato | G06K 9/0002 257/48 |
| 2002/0180710 A1 | 12/2002 | Roberts | |
| 2003/0151589 A1 | 8/2003 | Bensen et al. | |
| 2004/0008039 A1 | 1/2004 | Morimoto | |
| 2004/0080216 A1 * | 4/2004 | Morimoto | G01L 1/142 307/125 |
| 2004/0112149 A1 | 6/2004 | Gebert | |
| 2004/0155991 A1 | 8/2004 | Lowles et al. | |
| 2004/0227736 A1 | 11/2004 | Kamrath et al. | |
| 2005/0052425 A1 | 3/2005 | Zadesky et al. | |
| 2005/0057266 A1 | 3/2005 | Morimoto | |
| 2005/0057528 A1 | 3/2005 | Kleen | |
| 2005/0061082 A1 | 3/2005 | Dallenbach et al. | |
| 2005/0284234 A1 * | 12/2005 | Sato | G01L 1/205 73/818 |
| 2006/0017701 A1 | 1/2006 | Marten et al. | |
| 2006/0197753 A1 | 9/2006 | Hotelling | |
| 2007/0063982 A1 | 3/2007 | Tran | |
| 2007/0229464 A1 | 10/2007 | Hotelling et al. | |
| 2007/0229470 A1 | 10/2007 | Snyder et al. | |
| 2007/0236450 A1 | 10/2007 | Colgate et al. | |
| 2007/0257821 A1 | 11/2007 | Son et al. | |
| 2007/0268265 A1 | 11/2007 | XiaoPing | |
| 2008/0018608 A1 * | 1/2008 | Serban | G06F 3/0416 345/173 |
| 2008/0018611 A1 | 1/2008 | Serban et al. | |
| 2008/0062148 A1 | 3/2008 | Hotelling et al. | |
| 2008/0068348 A1 | 3/2008 | Rosenberg et al. | |
| 2008/0142352 A1 | 6/2008 | Wright | |
| 2008/0190210 A1 | 8/2008 | Harish et al. | |
| 2008/0202251 A1 | 8/2008 | Serban et al. | |
| 2008/0202824 A1 | 8/2008 | Phillipp et al. | |
| 2009/0002328 A1 | 1/2009 | Ullrich et al. | |
| 2009/0160682 A1 | 6/2009 | Bolender et al. | |
| 2009/0160763 A1 | 6/2009 | Cauwels et al. | |
| 2009/0167704 A1 | 7/2009 | Terlizzi et al. | |
| 2009/0243817 A1 | 10/2009 | Son | |
| 2009/0244017 A1 | 10/2009 | Pala et al. | |
| 2009/0267892 A1 | 10/2009 | Faubert | |
| 2010/0018889 A1 | 1/2010 | Korpanty et al. | |
| 2010/0020039 A1 | 1/2010 | Ricks et al. | |
| 2010/0024573 A1 | 2/2010 | Daverman et al. | |
| 2010/0026664 A1 | 2/2010 | Geaghan | |
| 2010/0033354 A1 | 2/2010 | Ejlersen | |
| 2010/0079384 A1 | 4/2010 | Grivna | |
| 2010/0090813 A1 | 4/2010 | Je et al. | |
| 2010/0107770 A1 | 5/2010 | Serban et al. | |
| 2010/0108409 A1 | 5/2010 | Tanaka et al. | |
| 2010/0149128 A1 | 6/2010 | No et al. | |
| 2010/0156814 A1 | 6/2010 | Weber et al. | |
| 2010/0244628 A1 | 9/2010 | Nishigaki et al. | |
| 2010/0250071 A1 | 9/2010 | Pala et al. | |
| 2011/0005845 A1 | 1/2011 | Hotelling et al. | |
| 2011/0025631 A1 | 2/2011 | Han | |
| 2011/0141053 A1 | 6/2011 | Bulea et al. | |
| 2011/0148811 A1 | 6/2011 | Kanehira et al. | |
| 2011/0148812 A1 | 6/2011 | Hente | |
| 2011/0175844 A1 | 7/2011 | Berggren | |
| 2011/0181548 A1 | 7/2011 | Sekiguchi | |
| 2011/0278078 A1 * | 11/2011 | Schediwy | G01L 1/146 178/18.06 |
| 2012/0075243 A1 | 3/2012 | Doi et al. | |
| 2012/0081332 A1 | 4/2012 | Atsuta et al. | |
| 2012/0090902 A1 | 4/2012 | Liu et al. | |
| 2012/0098783 A1 | 4/2012 | Badaye et al. | |
| 2012/0105333 A1 | 5/2012 | Maschmeyer et al. | |
| 2012/0242610 A1 | 9/2012 | Yasumatsu | |

FOREIGN PATENT DOCUMENTS

| | | |
|---|---|---|
| WO | 9718528 | 5/1997 |
| WO | 2005121729 A1 | 12/2005 |
| WO | 2007098171 A2 | 8/2007 |
| WO | 2009157614 A1 | 12/2009 |
| WO | 2010018889 A1 | 2/2010 |

OTHER PUBLICATIONS

Written Opinion of the International Searching Authority issued in PCT/US2012/052909 mailed Dec. 26, 2012 (4 pages).
International Search Report for corresponding International Application No. PCT/US2012/060500 mailed Jan. 2, 2013 (3 pages).
Written Opinion for corresponding International Application No. PCT/US2012/060500, mailed Jan. 2, 2013 (4 pages).
International Search Report for corresponding International Application PCT/US2012/052909, mailed Dec. 26, 2012 (3 pages).
International Search Report for corresponding International Application No. PCT/US2012/034540, mailed Nov. 30, 2012 (3 pages).
Written Opinion for corresponding International Application No. PCT/US2012/034540, mailed Nov. 30, 2012 (4 pages).
International Preliminary Report on Patentability issued in PCT/US2011/034261, dated Nov. 13, 2012 (6 pages).
Written Opinion of the International Searching Authority issued in PCT/US2011/034261, mailed Feb. 8, 2012 (5 pages).

(56) References Cited

OTHER PUBLICATIONS

International Search Report for corresponding International Application No. PCT/US2011/034261, mailed Feb. 8, 2012 (3 pages).
International Search Report for corresponding International Application No. PCT/US2010/029823, mailed Nov. 19, 2010 (4 pages).
Written Opinion for corresponding International Application No. PCT/US2010/029823, mailed Nov. 19, 2010 (4 pages).

* cited by examiner

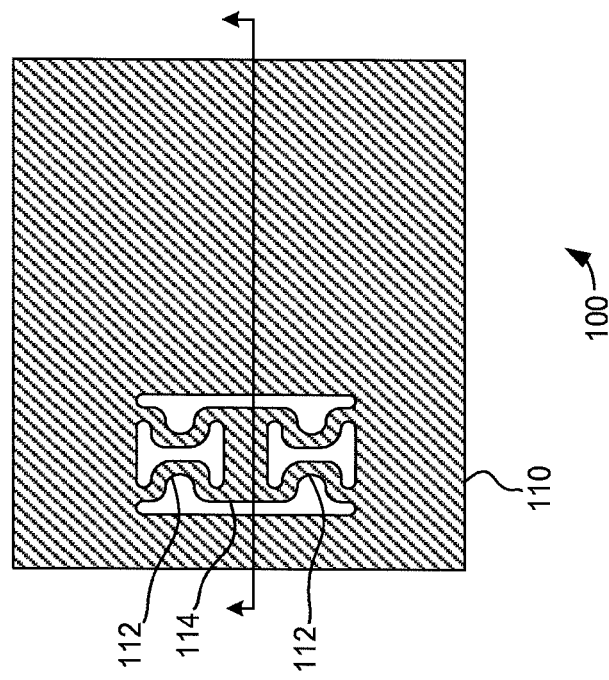
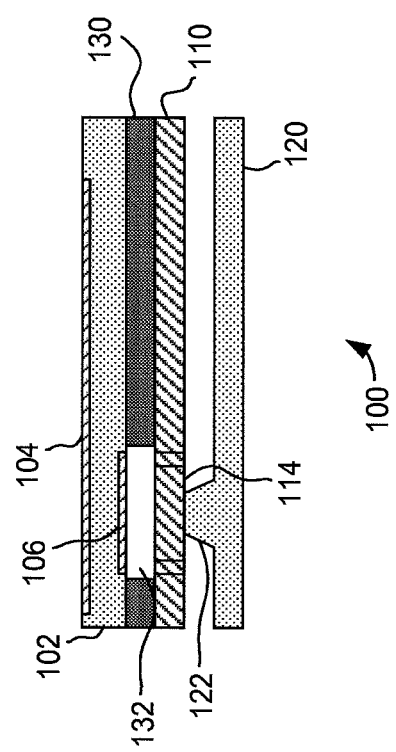

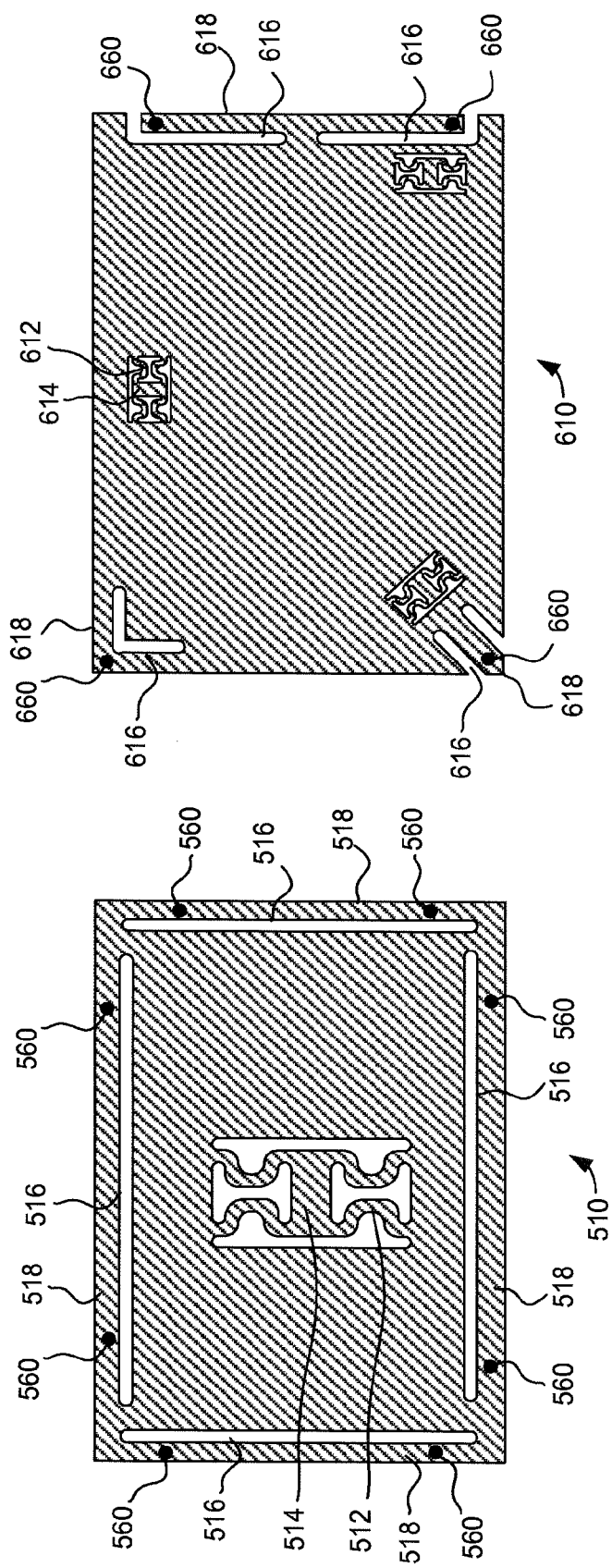

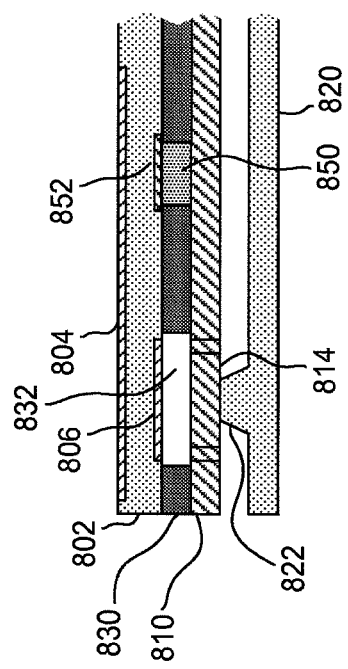

INPUT DEVICE WITH FORCE SENSING

PRIORITY DATA

This application claims priority of U.S. patent application Ser. No. 13/316,279, which was filed on Dec. 9, 2011, and U.S. Provisional Patent Application Ser. No. 61/551,346, which was filed on Oct. 25, 2011, which are incorporated herein by reference.

FIELD OF THE INVENTION

This invention generally relates to electronic devices, and more specifically relates to input devices, such as proximity sensor devices and force sensor devices.

BACKGROUND OF THE INVENTION

Proximity sensor devices (also commonly called touch sensor devices) are widely used in a variety of electronic systems. A proximity sensor device typically includes a sensing region, often demarked by a surface, in which input objects can be detected. Example input objects include fingers, styli, and the like. The proximity sensor device can utilize one or more sensors based on capacitive, resistive, inductive, optical, acoustic and/or other technology. Further, the proximity sensor device may determine the presence, location and/or motion of a single input object in the sensing region, or of multiple input objects simultaneously in the sensor region.

The proximity sensor device can be used to enable control of an associated electronic system. For example, proximity sensor devices are often used as input devices for larger computing systems, including: notebook computers and desktop computers. Proximity sensor devices are also often used in smaller systems, including: handheld systems such as personal digital assistants (PDAs), remote controls, and communication systems such as wireless telephones and text messaging systems. Increasingly, proximity sensor devices are used in media systems, such as CD, DVD, MP3, video or other media recorders or players. The proximity sensor device can be integral or peripheral to the computing system with which it interacts.

In the past, some proximity sensors have been implemented with additional ability to detect and determine force applied to a surface of the sensor. For example, by making an estimation of applied force by measuring the increased capacitance that is the result of the increased contact area when a finger is pressed against the surface. Unfortunately, some implementations of these proximity sensors have had limited accuracy when estimating applied force using these techniques. Because of questionable accuracy, such sensors have typically had limited ability to use such determined force as a basis for determining user input. This limits the flexibility of the proximity sensor device to function as an input device. Thus, there exists a need for improvements in proximity sensor device, and in particular, the ability of proximity sensor devices to determine and respond to indications of applied force.

Other desirable features and characteristics will become apparent from the subsequent detailed description and the appended claims, taken in conjunction with the accompanying drawings and the foregoing technical field and background.

BRIEF SUMMARY OF THE INVENTION

Devices and methods are provided that facilitate improved input device performance. The devices and methods utilize a first substrate with proximity sensor electrodes and at least a first force sensor electrode disposed on the first substrate. A second substrate is physically coupled to the first substrate, where the second substrate comprises a spring feature and an electrode component. The electrode component at least partially overlaps the first force sensor electrode to define a variable capacitance between the first force sensor electrode and the electrode component. The spring feature is configured to facilitate deflection of the electrode component relative to the first force sensor electrode to change the variable capacitance. A measure of the variable capacitance may be calculated and used to determine force information regarding the force biasing the input device.

In another embodiment the devices and methods utilize a transmitter force sensor electrode and receiver force sensor electrode disposed on a first substrate. The electrode component overlaps at least a portion of the transmitter force sensor electrode and the receiver force sensor electrode to define a variable capacitance between the transmitter force sensor electrode and the receiver force sensor electrode that changes with the deflection of the electrode component.

In some embodiments the second substrate comprises a conductive layer that is patterned to define the spring feature and the electrode component. In other embodiments the conductive layer may be further patterned to define an attachment component used to couple to a casing.

In some embodiments a processing system is communicatively coupled to the first force sensor electrode and is configured to determine a capacitance value of the variable capacitance and to determine force information from the capacitance value. In other embodiments the processing system is further communicatively coupled to the proximity sensor electrodes and is configured to determine positional information for objects that are in a sensing region using the proximity sensor electrodes. These implementations offer potential advantages of sharing components between the proximity sensor and the force sensor in the input device. Stated another way, these implementations allow force sensing to be added to a proximity sensor with relatively low additional cost and complexity.

In another embodiment a method of forming an input device is provided that comprises providing a first substrate and disposing a plurality of sensor electrodes and a first force sensor on the first substrate. A second substrate is patterned to define a spring feature and an electrode component, where the spring feature is configured to facilitate deflection of the electrode component. The second substrate is physically coupled to the first substrate such that the electrode component at least partially overlaps the first force sensor electrode to define a variable capacitance between the first force sensor electrode and the electrode component. When so coupled, the deflection of the electrode component feature relative to the first force sensor electrode changes the variable capacitance. A measure of the variable capacitance may be calculated and used to determine force information regarding the force biasing the input device.

In another embodiment an input device is provided that comprises a plurality of proximity sensor electrodes, a transmitter force sensor electrode and a receiver force sensor electrode disposed on a substrate. A conductive layer is patterned to define at least one attachment component, at least one spring feature and at least one electrode component. The patterned conductive layer is physically coupled to the first substrate such that the electrode component at least partially overlaps the transmitter force sensor electrode and the receiver force sensor electrode to define a variable capacitance between the transmitter force sensor electrode, the receiver force sensor electrode and the electrode component. The spring feature is configured to facilitate deflection of the electrode component relative to the transmitter force sensor electrode and the receiver force sensor electrode to change the variable capacitance. A casing is provided that comprises a mating element and a force transmission element. The mating element is configured to be coupled to the attachment component of the conductive layer. The mating element and the force transmission element are dimensioned such that the force transmission element applies preload force to the electrode component when the attachment element is coupled to the attachment component and such that the force transmission element transmits additional force to electrode component in response to force applied by a user.

Thus, the various embodiments provide improved input device performance by facilitating the determination of force information for one or more input objects.

BRIEF DESCRIPTION OF DRAWINGS

The preferred exemplary embodiment of the present invention will hereinafter be described in conjunction with the appended drawings, where like designations denote like elements, and:

FIGS. 1A-C are a cross-sectional side view and partial top views of an input device in accordance with an embodiment of the invention;

FIGS. 3-6 are top views of a patterned second substrate in accordance with embodiments of the invention;

FIG. 8 is a cross-sectional side view of input devices in accordance with an embodiment of the invention.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1C:
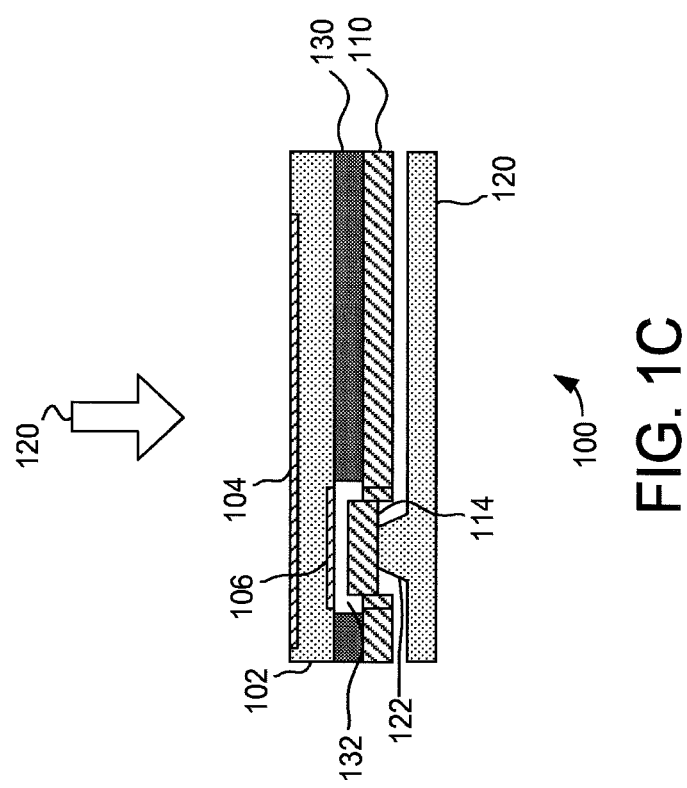

Devices and methods are provided that facilitate improved input device performance. Turning now to FIGS. 1A-1C, cross-sectional and partial top views of an input device 100 is illustrated. The input device 100 includes a first substrate 102 with proximity sensor electrodes 104 and at least a first force sensor electrode 106 disposed on the first substrate. A second substrate 110 is physically coupled to the first substrate 102, where the second substrate comprises at least one spring feature 112 and at least one electrode component 114. The electrode component 114 at least partially overlaps the first force sensor electrode 106 to define a variable capacitance between the first force sensor electrode 106 and the electrode component. The spring feature 112 is configured to facilitate deflection of the electrode component 114 relative to the first force sensor electrode 106 to change the variable capacitance. A measure of the variable capacitance may be calculated and used to determine force information regarding the force biasing the input device.

In the illustrated embodiment the input device 100 also includes a spacing layer 130, where the spacing layer 130 is patterned to define an opening 132 such that the spacing layer 130 does not overlap at least a portion of the electrode component 114 and to provide a spacing between the electrode component 114 and the first force sensor electrode 106. Any type of suitable material may be used to form the spacing layer 130, and any type of attachment mechanism may be used to physically couple the spacing layer 130 to the first substrate 102 and second substrate 110. In one embodiment, a thickness of the spacing layer 130 is between $1/10^{th}$ and 1 millimeters. In another embodiment, the spacing layer 130 comprises a double sided adhesive configured to physically couple the first substrate 102 and second substrate 110.

Also in the illustrated embodiment, the input device 100 also includes a casing 120. The casing 120 includes force transmission element 122 that is configured to transmit force to the electrode component 114. Specifically, the force transmission element 122 is physically coupled to the electrode component 114 such that when an input object (such as a finger) applies force, the force transmission element 122 causes the electrode component 114 to bias relative to the first force electrode 106, thus changing the variable capacitance. A measurement of the change variable capacitance can be used to determine force information regarding the force biasing the force transmission element 122.

An example of such force biasing is illustrated in FIG. 1C. As illustrated in FIG. 1C, an increase in the force biasing the input device 100 (as represented by arrow 120) causes the force transmission element 122 to transmit force to the electrode component 114, causing the electrode component 114 to move relative to the first force electrode 106. As the distance between the electrode component 114 and the first force electrode 106 changes, the variable capacitance, defined at least in part by electrode component 114 and first force electrode 106, changes. A measurement of the variable capacitance between electrodes can thus be used to determine force information for the object providing the biasing force.

In the illustrated embodiment, the second substrate 110 comprises a conductive layer, where the second substrate is patterned to define the spring feature 112 and electrode component 114. This is best illustrated in FIG. 1B, where it can be seen that the spring features 112 and the electrode components 114 are defined by patterning to remove selected portions of material from the second substrate. Such a patterning of the second substrate may be performed using any suitable technique, including laser cutting, chemical etching, lithographic techniques, stamping, etc. Using such techniques may improve ease of device manufacturing and thus reduce cost and complexity.

In some embodiments the second substrate 110 may comprise a "stiffener" layer used to provide increased rigidity to the input device while at the same time having desirable material properties in order to facilitate consistent and repeatable movement of the electrode component relative to the first substrate. For example, stainless steel, beryllium copper, phosphor bronze, and the like may be used as the "stiffener" layer material for the second substrate 110. In some embodiments, the second substrate 110 comprises a non-conductive material where the electrode components 114 are formed with conductive material (either integrally or disposed onto the second substrate).

Figure 2B:
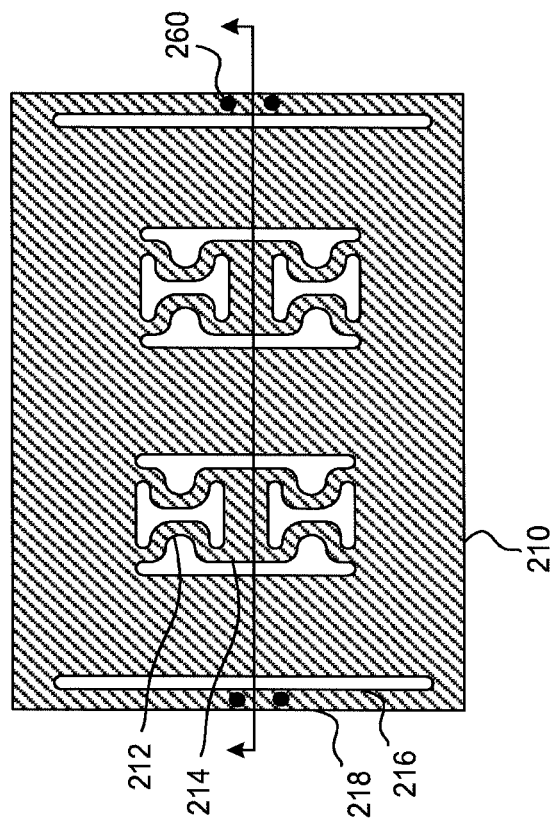
FIGS. 2A-B are a cross-sectional side view and a partial top view of an input device in accordance with an embodiment of the invention.
Figure 2A:
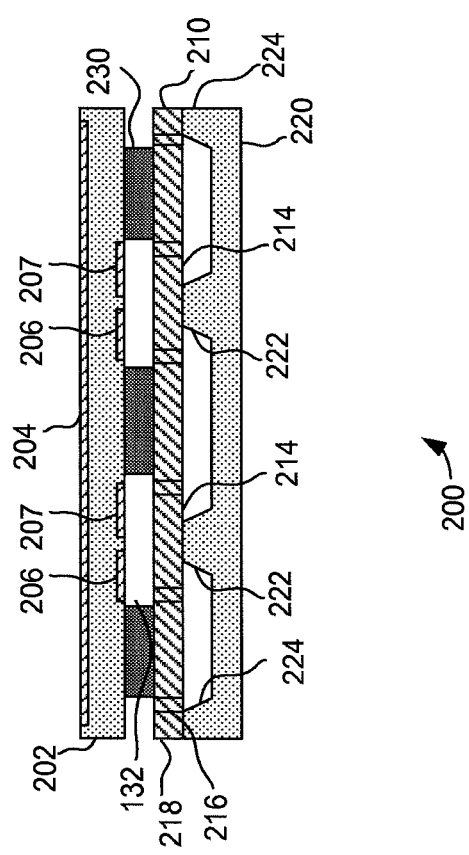

Turning now to FIGS. 2A-2B, a cross-sectional and partial top view of an input device 200 is illustrated. This embodiment differs from that illustrated in FIG. 1 in that it includes two force sensors, with each force sensor using a transmitter force sensor electrode and a receiver force sensor electrode. The input device 200 includes a first substrate 202 with proximity sensor electrodes 204. Also disposed on the first substrate 202 are transmitter force sensor electrodes 206 and receiver force sensor electrodes 207. A second substrate 210 is physically coupled to the first substrate 202, where the second substrate comprises spring features 212 and electrode components 214. The electrode components 214 are arranged to at least partially overlap a transmitter force sensor electrode 206 and a receiver force sensor electrode 207 to define a variable capacitance between the transmitter force sensor electrode 206, receiver force sensor electrode 207 and electrode component 214. The spring features 212 are configured to facilitate deflection of their respective electrode components 214 relative to the transmitter force sensor electrode 206 and receiver force sensor electrode 207 to change the variable capacitance. A measure of the variable capacitance may be calculated and used to determine force information regarding the force biasing the input device.

In the illustrated embodiment the input device 200 also includes a spacing layer 230, where the spacing layer 230 is patterned to define openings 232 such that the spacing layer does not overlap at least a portion of the transmitter force sensor electrode 206 and receiver force sensor electrode 207 and to provide a spacing between the electrode component 214 and the transmitter force sensor electrode 206 and receiver force sensor electrode 207.

Also in this illustrated embodiment the second substrate is further patterned to define an attachment feature 218. In this illustrated embodiment, the attachment feature 218 in the second substrate 210 is defined in part by a slot 216 formed in the second substrate. Specifically, the slot 216 forms an attachment feature 218 that comprises a relatively thin piece of material such that the attachment feature is configured to deform elastically in response to a force applied to the first substrate.

Also in the illustrated embodiment, the input device 200 also includes a casing 220. The casing 220 includes force transmission elements 222 that are configured to transmit force to the electrode components 214. Specifically, each force transmission element 222 is physically coupled to a corresponding electrode component 214 such that when an input object (such as a finger) applies force, the force transmission element 222 causes the electrode component 214 to bias relative to the transmitter electrode 206 and receiver electrode 208, thus changing the variable capacitance. A measurement of the change variable capacitance can be used to determine force information regarding the force biasing the force transmission element 222. In the illustrated embodiment, the transmission elements 222 are shown to be integrally formed with the casing 220. In other embodiments, the transmission elements 222 may be non-integral features which are disposed between the casing 222 and the second substrate 210 which are configured to bias the electrode component 214 in response to a force applied by an input object.

In this embodiment the casing 220 also comprises a mating feature 224. The mating feature 214 is configured to be coupled to the attachment feature 218 of the second substrate 210. For example, using any suitable attachment technique, such as welding, soldering, adhesives and the like.

In one embodiment, the mating feature 224 and the force transmission element 222 are dimensioned such that the force transmission element 222 applies a force to the electrode component when the casing 220 is physically coupled to the second substrate 210 via mating features 224.

Specifically, in one particular embodiment these attachment features 218 are configured to operate as "spring beams" that, when attached to the mating features 224 of the casing 220 attach the second substrate 210 (and any other physically coupled substrates) to the casing 220. Additionally, without requiring additional elements, such an attachment mechanism provides "hold down" springs of the input device relative to the casing. In these and other embodiments the casing 220 may be an integral part of an electronic device (e.g. a palm rest) or further coupled to a base substrate of the electronic device.

In some embodiments the attachment features 218 may be spot welded to mating features 224 in the casing 220, with the features configured so as to slightly pre-load the "spring beams" once welded. As a result, when no force is imparted by an input object, the transmission elements 222 are pulled to be in contact with the electrode components 214. Furthermore, any force imparted by an input object will bias the electrode components 214 further towards the force sensor electrodes.

In FIG. 2B, an example of such a welding attachment is shown at points 260. Specifically, the four points 260 show example locations where the attachment features 218 may be welded or otherwise attached to the mating features 224. In this embodiment the attachment points are located at a midpoint of the "spring beam", and thus may be used to provide an effective pre-load on the spring beams. However, as will be shown later in FIG. 5 various other combinations of beam shapes and attachment locations can be used depending on the acceptable shear of the substrate, amount of deflection desired, etc.

It should be noted that when so provided, the use of such an attachment feature and mating feature may reduce the X/Y/Z form-factor that is required. Additionally, such a design may simplify assembly, while not increasing height. Finally, it should be noted that the attachment features 218 may be formed in other portions of the second substrate 210. Such an example will be shown in FIG. 5 below. Finally, alternate attachment methods, other than welds, can be employed to attach the input device to the casing. Examples are metal crimps, screws, rivets, etc.

Again, in the illustrated embodiment the second substrate 210 comprises a conductive layer, where the conductive layer is patterned to define the spring features 212, the electrode components 214, and the attachment features 218. This is best illustrated in FIG. 2B, where a top view of the second substrate 210 shows that the spring features 212, the electrode components 214 and the attachment features 218 are defined by patterning to remove selected portions of material from the conductive layer. Such a patterning of the conductive layer may be performed using any suitable technique, including laser cutting, chemical etching, lithographic techniques, stamping, etc. Using such techniques may improve ease of device manufacturing and thus reduce cost and complexity.

As noted above, FIGS. 1 and 2 illustrate two examples of a second substrate that comprises a patterned conductive layer, where the second substrate is patterned to define spring features, electrode components, and in the case of FIG. 2, attachment features. However, it should be noted that these are merely examples of how such a second substrate may be patterned, and that the resulting spring features, electrode components, and attachment features could be configured in a variety of different ways.

Figure 3:
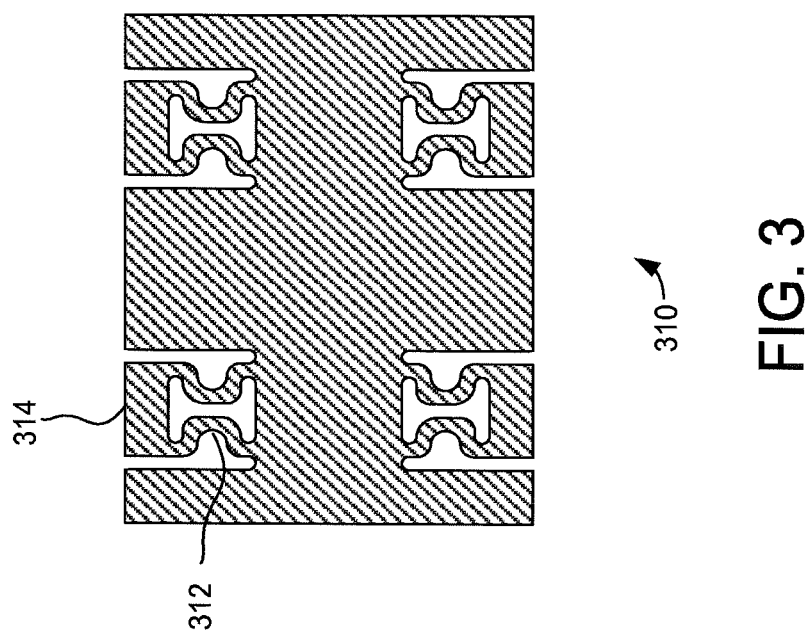

Turning now to FIG. 3, a top view of another example second substrate 310 is illustrated. Again, the patterned second substrate 310 comprises spring features 312 and electrode components 314. The electrode components 314 are arranged such that, when assembled, they at least partially overlap one or more force electrodes (not shown in this FIG) to define a variable capacitance. The spring features 312 are configured to facilitate deflection of their respective electrode components 314 relative to these force electrodes to change the variable capacitance. And again, a measure of the variable capacitance may be calculated and used to determine force information regarding the force biasing the input device.

In the example embodiment of FIG. 3, the conductive layer is patterned such that four electrode components 314 are arranged about the perimeter of the second substrate 310. Furthermore, each electrode component 314 differs from those in FIGS. 1 and 2 in that they are coupled to only two spring features 312, and at only one side of the electrode component 314. Again, the spring features 312 and electrode component 314 may be defined by patterning to remove selected portions of material from the second substrate.

Figure 4:
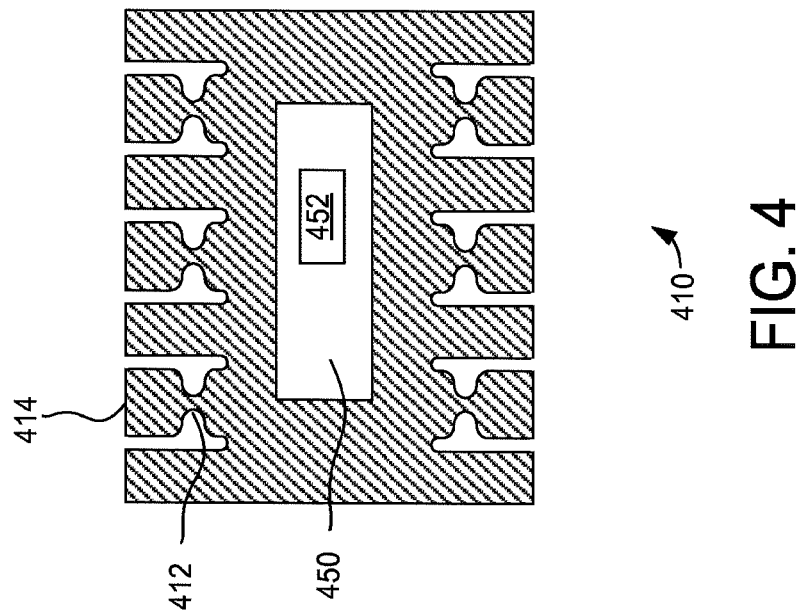

Turning now to FIG. 4, a top view of another example second substrate 410 is illustrated. In this embodiment the patterned second substrate 410 again comprises spring features 412 and electrode components 414. The electrode components 414 are arranged such that, when assembled, they at least partially overlap one or more force electrodes to define a variable capacitance. The spring features 412 are configured to facilitate deflection of their respective electrode components 414 relative to these force electrodes to change the variable capacitance. In the example embodiment of FIG. 4, the conductive layer is patterned such that six electrode components 414 are arranged about the perimeter of the second substrate 410. Furthermore, each electrode component 414 differs from those in previous embodiments in that it is coupled to only one spring feature 412. Again, the spring features 412 and electrode component 414 may be defined by patterning to remove selected portions of material from the conductive layer, using any suitable patterning technique.

Also illustrated in FIG. 4 is a component zone 450. In general, the component zone 450 may be defined by patterning to remove selected portions of material from the second substrate 410. The component zone 450 is an area which may overlap one or more processing elements 452 which may be located on the first substrate (not shown in this figure). These processing elements 452 may include portions of a suitable processing system, such as those described below with reference to FIG. 7.

As has been shown in FIGS. 3-4, a variety of electrode component and spring feature patterns are possible. In some embodiments, at least three electrode components are patterned in the second substrate to form at least three variable capacitances representative of a force applied to the input surface of the input device. As will be described further below, the at least three variable capacitances may be calculated and used to determine force information regarding a force applied to the input surface.

Turning now to FIG. 5, a top view of another exemplary second substrate 510 is illustrated. In this embodiment the patterned second substrate 510 comprises spring features 512 and one electrode component 514. In this illustrated embodiment, the single electrode component is arranged at the center of the device. Again, the electrode component 514 would be positioned such that, when assembled, it at least partially overlaps one or more force electrodes on the first substrate to define a variable capacitance. In this illustrated embodiment, four spring features 512 are coupled to the single electrode component 514. Again, the spring features 512 and electrode component 514 may be defined by patterning to remove selected portions of material from the conductive layer, using any suitable patterning technique.

Also in this illustrated embodiment the second substrate 510 is further patterned to define four attachment features 518. In this illustrated embodiment the four attachment features 518 are arranged in proximity to the four edges of the second substrate. This allows the second substrate to be reliably attached to a casing using the four attachment features 518. Furthermore, each of the attachment features 518 allows the second substrate to move in response to force applied by an input object. Specifically, by bonding the four attachment features 518 to a casing, the sensor device can be made responsive to force applied and allowed to move. Furthermore, by dimensioning such features appropriately, a desired preload amount of force may be applied by the transmission elements on to the electrode components.

In this illustrated embodiment, the attachment features 518 are each defined in part by a slot 516 formed in the second substrate. Specifically, the slot 516 forms an attachment feature 518 that comprises a relatively thin piece of material such that the attachment feature is configured deform in response to a force applied to the first substrate.

As described above, in some embodiments the attachment features 518 may be spot welded to mating features on a casing or other suitable connection points. In FIG. 5 examples of such welding attachment is shown at points 560. Specifically, the points 560 show example locations where the attachment features 518 may be welded or otherwise attached to corresponding mating features.

Turning now to FIG. 6, a top view of another example second substrate 610 is illustrated. In this embodiment the patterned second substrate 610 comprises spring features 612 and electrode components 614 for three different force sensors. In this illustrated embodiment, the electrode components 614 are arranged near the edges of the device. Again, the electrode component 614 would be positioned such that, when assembled, it at least partially overlaps one or more force electrodes on the first substrate to define variable capacitances. Again, the spring features 612 and electrode component 614 may be defined by patterning to remove selected portions of material from the conductive layer, using any suitable patterning technique.

Also in this illustrated embodiment the second substrate 610 is further patterned to define three attachment features 618. In this illustrated embodiment two of attachment features 618 are arranged in proximity to two of the corners, and the other attachment feature 618 is near an edge of the second substrate. Again, these are examples of attachment features that can be provided to allow the second substrate to move in response to force applied by an input object. Specifically, by bonding the attachment features 618 to a casing, the sensor device can be made responsive to force applied and allowed to move. Furthermore, by dimensioning such features appropriately, a desired preload amount of force may be applied by the transmission elements on to the electrode components.

In this illustrated embodiment, the attachment features 618 are each defined in part by one or more slots 616 formed in the second substrate. Specifically, the slots 616 define attachment features 618 that each comprises a relatively thin piece of material such that the attachment feature is configured deform in response to a force applied to the first substrate.

As described above, in some embodiments the attachment features 618 may be spot welded to mating features on a casing or other suitable connection points. In FIG. 6 examples of such welding attachment is shown at points 660. Specifically, the points 660 show example locations where the attachment features 618 may be welded or otherwise attached to corresponding mating features.

In some embodiments a processing system is communicatively coupled to the force sensor electrodes (including transmitter and receiver force sensor electrodes) and is configured to determine a capacitance value of the variable capacitance and to determine force information from the capacitance value. In other embodiments the processing system is further communicatively coupled to the proximity sensor electrodes and is configured to determine positional information for objects that are in a sensing region using the proximity sensor electrodes. These implementations offer potential advantages of sharing components between the proximity sensor and the force sensor in the input device. Stated another way, these implementations allow force sensing to be added to a proximity sensor with relatively low additional cost and complexity.

Figure 7:
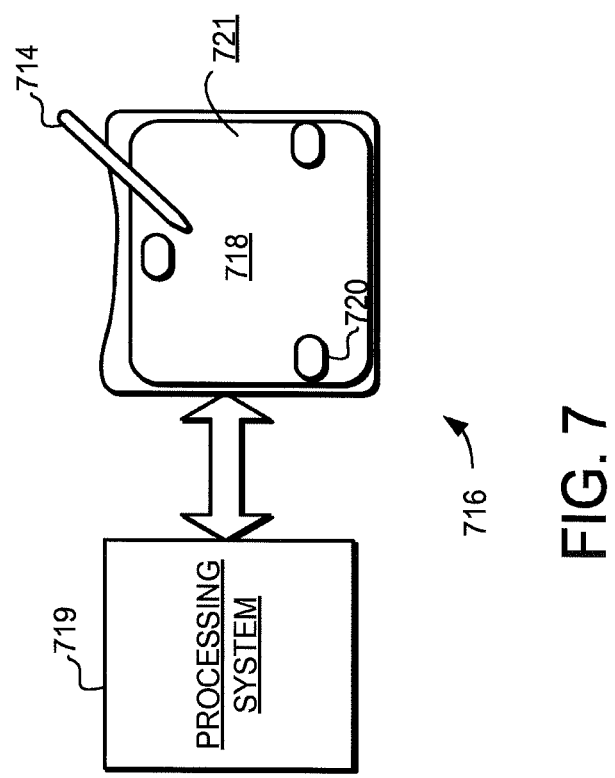
FIG. 7 is a block diagram of a input device in accordance with embodiments of the invention.

Turning now to FIG. 7, a block diagram illustrates an input device 716 that combines a proximity sensor with a plurality of force sensors. The input device 716 uses both the proximity sensor and the force sensors to provide an interface for the electronic system. The input device 716 has a processing system 719, an input surface 721, sensing region 718 and three force sensors 720 implemented proximate the sensing region 718. As will be described in greater detail below, each of the force sensors 720 may be implemented with any of the various embodiments of force sensing input devices described above and below, and thus may be configured to provide a variety of force sensing. Furthermore, it should be noted that one or more force sensors may be provided inside or outside the perimeter of the input surface 721. Not shown in FIG. 7 is an array of sensing electrodes that are adapted to capacitively sense objects in the sensing region 718.

The input device 716 is adapted to provide user interface functionality by facilitating data entry responsive to the position of sensed objects and the force applied by such objects. Specifically, the processing system 719 is configured to determine positional information for objects sensed by a sensor in the sensing region 718. This positional information can then be used by the system 700 to provide a wide range of user interface functionality. Furthermore, the processing system 719 is configured to determine force information for objects from measures of force determined by the force sensors 720. This force information can then also be used by the system 700 to provide a wide range of user interface functionality. For example, by providing different user interface functions in response to different levels of applied force by objects in the sensing region.

Force information for input objects may be determined by a variety of different mathematical techniques. An input device may be provided with N force sensors, each providing a force measurement $F_i$. As described above, the input device is configured to determine positional information for multiple objects using a sensor, such as a capacitive proximity sensor. In this example, the position of M objects is expressed using coordinates $(x_j, y_j)$. When the $j^{th}$ object applies a force $G_j$ at a location $(x_j, y_j)$, the response of the $i^{th}$ force sensor can be modeled as $h_i(x_j, y_j) \cdot G_j$ where $h_i$ is a function of position that may either be derived from the input device mechanical design or inferred from calibration data. Assuming that the response of the system to multiple forces is additive, the force measurement at each force sensor can be expressed as:

$$F_i = \sum_{j}^{M} h_i(x_j, y_j) \cdot G_j$$

Or in matrix notation, $$f = H(x,y) \cdot g$$

To reconstruct the finger forces g from the observations f (and the observed positions x and y) the equation is inverted. In general, the number of fingers is not equal to the number of sensors (M≠N) and the responses are not linearly independent (H is not invertible). A variety of regularization techniques can be applied to solve this problem. In one embodiment, a Tikhonov regularization is used to reconstruct the finger forces g, such that:

$$\hat{g} = (H^T \cdot H + \alpha^2 I)^{-1} \cdot H^T \cdot f$$

where $\alpha > 0$ is the Tikhonov factor. This is defined for any number and arrangement of fingers and sensors (i.e. for all M, N and H). For appropriate values of a it is close to the true inverse if the true inverse exists. When the inverse is not defined (e.g., the system is over- or under-constrained) the estimate remains consistent with the observations, stable, and bounded.

The estimate ĝ minimizes the sum of the squared error and the norm of the solution vector $$\hat{g} = \arg\min(\|H(x,y) \cdot g - f\|^2 + \alpha^2 \|g\|^2)$$

In the limit $\alpha \rightarrow 0$ this approaches the least squares solution (the pseudo-inverse). For $\alpha \neq 0$ we take into consideration the magnitude of the solution vector as well as the goodness of fit, which stabilizes the estimate when $(H^T \cdot H)^{-1}$ would otherwise become ill-conditioned.

The Tikhonov regularization can be interpreted as a Bayesian statistical prior on the size of finger forces we anticipate. This interpretation can motivate a choice of α as the inverse of the expected variance of finger forces. More generally, if additional information about the forces is available (such as the reconstructed forces at a previous time, or a low force suggested by a small contact area), it can naturally be incorporated into the Tikhonov method by replacing the scalar α with a matrix T describing the expected (co)variance of the finger forces.

In embodiments comprising a rigid sensor that is mounted on a system of ideal springs, the response functions will be linear:

$$h_i(x_j, y_j) = k_{ix} \cdot x_j + k_{iy} \cdot y_j + k_{i0}$$

$$H(x,y) = K \cdot [xy1]^T$$

In embodiments comprising non-rigid/non-ideal systems, the response functions could be fitted to observations using as a combination of L basis functions (such as a polynomial or Fourier basis), such that $$h_i(x_j, y_j) = \sum_{k=1}^{L} c_{ki} \cdot b_k(x_j, y_j)$$

Such systems can still use the Tikhonov estimator, which depends only on linearity with respect to applied force, and not on linearity with respect to finger position.

In one embodiment, an input device comprising three force sensors mounted at coordinates (−0.5, −0.5), (+0.5, −0.5), (0, 0), as such:

$$h_0(x,y) = -x-y$$

$$h_1(x,y) = +x-y$$

$$h_2(x,y) = 1+2y$$

This system can accurately reconstruct the forces of one finger, two (non-co-located) fingers and of three non-co-linear fingers. For three fingers that lie on a straight line or four or more fingers, the system is under-determined; many possible finger forces g are consistent with the observation f. In one embodiment, the regularization chooses a reconstruction ĝ that requires the least applied force.

For example, when three fingers are evenly spaced along the line, the observation is unable to distinguish between linear combinations of the vectors g=(3, 0, 3) and g=(0, 6, 0). In this situation, the reconstruction will propose g≈(2, 2, 2).

In another embodiment, an input device comprises four sensors mounted at the corner coordinates (±0.5,±0.5), as such:

$$h_i(x,y) = 0.25 \pm x \pm y$$

In some embodiments, the assumption of rigidity renders the observation by the fourth sensor redundant, so this system has the same reconstruction capabilities as the three sensor system. Redundant sensors can have other advantages, such as robustness against failure of one or more sensors.

In some embodiments, a not-rigid input surface results in non-linear response functions. In one example, a non-rigid system with four sensors at the corner coordinates 0.5,±0.5) comprises the response functions $$h_i(x,y) = (0.5 \pm x)(0.5 \pm y)$$

The presence of an x·y term corresponds to saddle-shaped bending of the surface. This bending allows this system to measure four independent values. The system can accurately reconstruct one and two (non-co-located) fingers, and most spatial configurations of three and four fingers. Regularization provides acceptable estimates for the remaining configurations.

It should be noted that the above described technique is just one example of the type of techniques that can be used to determine for information. For example, other techniques that may be adapted for use in determining force information are described in U.S. Patent Publication No. US-2011-0141053-A1, entitled "SYSTEM AND METHOD FOR MEASURING INDIVIDUAL FORCE IN MULTI-OBJECT SENSING", which is incorporated herein by reference.

The input device 716 is sensitive to input by one or more input objects (e.g. fingers, styli, etc.), such as the position of an input object 714 within the sensing region 718. Sensing region 718 encompasses any space above, around, in and/or near the input device 716 in which the input device 716 is able to detect user input (e.g., user input provided by one or more input objects 714). The sizes, shapes, and locations of particular sensing regions may vary widely from embodiment to embodiment. In some embodiments, the sensing region 718 extends from a surface of the input device 714 in one or more directions into space until signal-to-noise ratios prevent sufficiently accurate object detection. The distance to which this sensing region 718 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 714, contact with an input surface (e.g. a touch surface) of the input device 714, contact with an input surface of the input device 714 coupled with some amount of applied force or pressure, and/or a combination thereof. In various embodiments, input surfaces may be provided by surfaces of casings within which the sensor electrodes reside, by face sheets applied over the sensor electrodes or any casings, etc.

The input device 714 may utilize any combination of sensor components and sensing technologies to detect user input in the sensing region 718. The input device 714 comprises one or more sensing elements for detecting user input. As several non-limiting examples, the input device 714 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 714, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 714, one or more sensing elements pick up loop currents induced by a resonating coil or pair of coils. Some combination of the magnitude, phase, and frequency of the currents may then be used to determine positional information.

In some capacitive implementations of the input device 714, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 7, a processing system 719 is shown as part of the input device 716. The processing system 719 is configured to operate the hardware of the input device 716 to detect input in the sensing region 718. The processing system 719 comprises parts of or all of one or more integrated circuits (ICs) and/or other circuitry components. For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 719 also comprises electronically-readable instructions, such as firmware code, software code, and/or the like. In some embodiments, components composing the processing system 719 are located together, such as near sensing element(s) of the input device 716. In other embodiments, components of processing system 719 are physically separate with one or more components close to sensing element(s) of input device 716, and one or more components elsewhere. For example, the input device 716 may be a peripheral coupled to a desktop computer, and the processing system 719 may comprise software configured to run on a central processing unit of the desktop computer and one or more ICs (perhaps with associated firmware) separate from the central processing unit. As another example, the input device 716 may be physically integrated in a phone, and the processing system 719 may comprise circuits and firmware that are part of a main processor of the phone. In some embodiments, the processing system 719 is dedicated to implementing the input device 716. In other embodiments, the processing system 719 also performs other functions, such as operating display screens, driving haptic actuators, etc.

The processing system 719 may be implemented as a set of modules that handle different functions of the processing system 719. Each module may comprise circuitry that is a part of the processing system 719, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 719 responds to user input (or lack of user input) in the sensing region 718 directly by causing one or more actions. Example actions include changing operation modes, as well as GUI actions such as cursor movement, selection, menu navigation, and other functions. In some embodiments, the processing system 719 provides information about the input (or lack of input) to some part of the electronic system (e.g. to a central processing system of the electronic system that is separate from the processing system 719, if such a separate central processing system exists). In some embodiments, some part of the electronic system processes information received from the processing system 719 to act on user input, such as to facilitate a full range of actions, including mode changing actions and GUI actions.

For example, in some embodiments, the processing system 719 operates the sensing element(s) of the input device 716 to produce electrical signals indicative of input (or lack of input) in the sensing region 718. The processing system 719 may perform any appropriate amount of processing on the electrical signals in producing the information provided to the electronic system. For example, the processing system 719 may digitize analog electrical signals obtained from the sensor electrodes. As another example, the processing system 719 may perform filtering or other signal conditioning. As yet another example, the processing system 719 may subtract or otherwise account for a baseline, such that the information reflects a difference between the electrical signals and the baseline. As yet further examples, the processing system 719 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

Likewise, the term "force information" as used herein is intended to broadly encompass force information regardless of format. For example, the force information can be provided for each object as a vector or scalar quantity. As another example, the force information can be provided as an indication that determined force has or has not crossed a threshold amount. As other examples, the force information can also include time history components used for gesture recognition. As will be described in greater detail below, positional information and force information from the processing systems may be used to facilitate a full range of interface inputs, including use of the proximity sensor device as a pointing device for selection, cursor control, scrolling, and other functions, In some embodiments, the input device 716 is implemented with additional input components that are operated by the processing system 719 or by some other processing system. These additional input components may provide redundant functionality for input in the sensing region 718, or some other functionality.

In some embodiments, the input device 716 comprises a touch screen interface, and the sensing region 718 overlaps at least part of an active area of a display screen. For example, the input device 716 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 716 and the display screen may share physical elements. For example, some embodiments may utilize some of the same electrical components for displaying and sensing. As another example, the display screen may be operated in part or in total by the processing system 719.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 719). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

As noted above, the input device 716 may be implemented with a variety of different types and arrangements of capacitive sensing electrodes. To name several examples, the capacitive sensing device may be implemented with electrode arrays that are formed on multiple substrate layers, including parts of the same layers used to form the force sensors. As one specific embodiment, electrodes for sensing in one direction (e.g., the "X" direction) may formed on a first layer (e.g., on a first side of the first substrates of FIGS. 1-2, or any other suitable substrate), while the electrodes for sensing in a second direction (e.g., the "Y" direction are formed on a second layer (e.g., on another side of the first substrate or any other suitable substrate).

In other embodiments, the electrodes for both the X and Y sensing may be formed on the same layer, with that same layer comprising any of the substrates described in FIGS. 1-2. In yet other embodiments, the electrodes may be arranged for sensing in only one direction, e.g., in either the X or the Y direction. In still another embodiment, the electrodes may be arranged to provide positional information in polar coordinates, such as "r" and "θ" as one example. In these embodiments the electrodes themselves are commonly arranged in a circle or other looped shape to provide "θ", with the shapes of individual electrodes used to provide "r". Also, a variety of different electrode shapes may be used, including electrodes shaped as thin lines, rectangles, diamonds, wedge, etc. Finally, a variety of conductive materials and fabrication techniques may be used to form the electrodes. As one example, the electrodes are formed by the deposition and etching of copper or ITO on a substrate.

To facilitate operation of the force sensor, it is generally desirable to provide an appropriate ohmic coupling between the processing system and patterned conductive layer— more specifically, the electrode components formed in the patterned conductive layer. Such a connection may be provided in a variety of ways. Turning now to FIG. 8, a cross-sectional view of an input device 800 is illustrated. The input device 800 again includes a first substrate 802 with proximity sensor electrodes 804 and at least a first force sensor electrode 806 disposed on the first substrate. A second substrate 810 is physically coupled to the first substrate 802, where the second substrate comprises at least one spring feature 812 and at least one electrode component 814. The electrode component 814 at least partially overlaps the first force sensor electrode 806 to define a variable capacitance between the first force sensor electrode 806 and the electrode component. The input device 100 also includes a spacing layer 830, where the spacing layer 830 is pattered to define an opening 832 such that the spacing layer 830 does not overlap at least a portion of the electrode component 814 and to provide a spacing between the electrode component 814 and the first force sensor electrode 806. Also in the illustrated embodiment, the input device 800 also includes a casing 820. The casing 820 includes force transmission element 822 that is configured to transmit force to the electrode component 814.

Also shown in the embodiment of FIG. 8 is a conductive path 850 included in the spacing layer 830. The conductive path 850 is configured to overlap a conductive pad 852 on the first substrate and provide a conductive path between a conductive layer of the second substrate 810 and the first substrate 802. Using the conductive path 850, the second substrate 810 may be ohmically coupled to the processing system to facilitate force sensing. As such, any suitable conductive materials or structure such as conductive gaskets, glues, or foams may be used to ohmically couple the second substrate 810 to the processing system.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:
1. An input device comprising:
    a first substrate;
    a plurality of proximity sensor electrodes disposed on a first surface of the first substrate, the plurality of the proximity sensor electrodes configured to detect objects in a sensing region of the input device;
    a plurality of force sensor electrodes disposed on a second surface of the first substrate and at least partially overlapping the plurality of the proximity sensor electrodes; and
    a second substrate physically coupled to the first substrate, the second substrate comprising a plurality of attachment features, a spring feature and an electrode component,
    wherein the electrode component at least partially overlaps the plurality of the force sensor electrodes and defines a variable capacitance between at least one force sensor electrode of the plurality of the force sensor electrodes and the electrode component, and
    wherein, in response to a force applied by an input object positioned over the plurality of the proximity sensor electrodes, the plurality of the attachment features facilitates deflection of the electrode component relative to the at least one force sensor electrode to change the variable capacitance.

2. The input device of claim 1 wherein the second substrate comprises a conductive layer, and wherein the conductive layer has a pattern that defines the spring feature and the electrode component.

3. The input device of claim 1 wherein the second substrate is physically coupled to the first substrate with a spacing layer comprising an adhesive, wherein the spacing layer is patterned to not overlap at least a portion of the electrode component and provide a spacing between the electrode component and the plurality of the force sensor electrodes.

4. The input device of claim 3 wherein the spacing layer comprises a conductive feature configured to ohmically couple the second substrate to a contact disposed on the first substrate.

5. The input device of claim 1 further comprising a touch screen interface configured to display a visual interface to a user of the input device.

6. The input device of claim 1 further comprising a casing, wherein the casing comprises a mating feature, the mating feature coupled to an attachment feature of the plurality of the attachment features of the second substrate to facilitate deflection of the electrode component in response to the force applied to the first substrate.

7. The input device of claim 1 further comprising a processing system, the processing system communicatively coupled to the plurality of the proximity sensor electrodes, the electrode component and the plurality of the force sensor electrodes, wherein the processing system comprises a circuitry that is configured to determine a capacitance value of the variable capacitance and to determine the force applied by the input object.

8. The input device of claim 7,
wherein the at least one force sensor electrode comprises a first force sensor electrode of the plurality of the force sensor electrodes and a second force sensor electrode of the plurality of the force sensor electrodes, wherein the first force sensor electrode comprises a transmitter electrode and the second force sensor electrode comprises a receiver electrode, and
wherein the processing system is configured to determine the capacitance value of the variable capacitance by measuring an amount of capacitance coupling between the first force sensor electrode and the second force sensor electrode.

9. A method of forming an input device comprising:
providing a first substrate comprising:
a plurality of proximity sensor electrodes disposed on a first surface of the first substrate, the plurality of the proximity sensor electrodes configured to detect objects in a sensing region; and
a plurality of force sensor electrodes disposed on a second surface of the first substrate and at least partially overlapping the plurality of the proximity sensor electrodes;
providing a second substrate having a pattern that defines an attachment feature, a spring feature, and an electrode component in the second substrate, the spring feature configured to facilitate deflection of the electrode component; and
physically coupling the second substrate to the first substrate such that the electrode component at least partially overlaps at least one force sensor electrode of the plurality of the force sensor electrodes to define a variable capacitance between the at least one force sensor electrode and the electrode component, and wherein, in response to a force applied by an input object positioned over the plurality of the proximity sensor electrodes, such that the deflection of the electrode component relative to the at least one force sensor electrode changes the variable capacitance.

10. The method of claim 9 wherein the second substrate comprises a metal layer, and wherein the metal layer is patterned by a technique selected from a group consisting of laser cutting, stamping and chemical etching.

11. The method of claim 9 wherein physically coupling the first and second substrates comprises providing a spacing layer between the second substrate and the first substrate, wherein the spacing layer is patterned to not overlap at least a portion of the electrode component and provides a spacing between the electrode component and the at least one force sensor electrode.

12. The method of claim 9 wherein providing the second substrate comprises forming a slot in the second substrate to define the attachment feature, wherein the attachment feature is configured to facilitate deflection of the electrode component in response to the force applied to the input device.

13. The method of claim 9 wherein the first substrate comprises a display screen.

14. The method of claim 13 further comprising mounting the second substrate to a casing having a mating feature, the mating feature configured to be coupled to the attachment feature of the second substrate, and wherein the mating feature, the attachment feature and the spring feature are dimensioned such that the force applied to the input device deflects the electrode component relative to the force sensor electrode.

15. The method of claim 9, further comprising communicatively coupling a processing system to the plurality of the proximity sensor electrodes and the plurality of force sensor electrodes, wherein the processing system comprises a circuitry that is configured to determine a capacitance value of the variable capacitance and to determine force information for an input object from the capacitance value.

16. An input device comprising:
a substrate;
a plurality of proximity sensor electrodes disposed on the substrate, the plurality of the proximity sensor electrodes configured to detect objects in a sensing region of the input device;
a transmitter force sensor electrode and a receiver force sensor electrode disposed on the substrate and at least partially overlapping the plurality of the proximity sensor electrodes;
a conductive layer physically coupled to the substrate, the conductive layer patterned to define at least one attachment feature in the conductive layer, at least one spring feature in the conductive layer and at least one electrode component in the conductive layer, wherein the electrode component at least partially overlaps the transmitter force sensor electrode and the receiver sensor electrode to define a variable capacitance, and wherein the spring feature is configured to facilitates deflection of the electrode component relative to the transmitter force sensor electrode and the receiver sensor electrode to change the variable capacitance; and
a casing, the casing comprising a mating element configured to be coupled to the attachment feature of the conductive layer, wherein the mating element, the attachment feature, the electrode component and the spring feature are dimensioned such that an input object applying a force onto the substrate, at a location overlapping the plurality of the proximity sensor electrodes, deflects the electrode component relative to the transmitter and receiver force sensor electrodes.

17. The input device of claim 16 further comprising a processing system communicatively coupled to the transmitter force sensor electrode and the receiver force sensor electrode, the processing system comprises a circuitry that configured to determine a capacitance value of the variable capacitance and to determine force information for the input object using the capacitance value.

18. The input device of claim 17 wherein the processing system is further communicatively coupled to the plurality of the proximity sensor electrodes, and wherein the processing system is further configured to operate the plurality of the proximity sensor electrodes to sense the objects in the sensing region.

19. The input device of claim 16 further comprising a slot in the conductive layer, wherein the slot defines at least in part the spring feature, and wherein the conductive layer is configured to deform in response to a force applied to the substrate.

20. The input device of claim 16 further comprising a display, wherein the plurality of the proximity sensor electrodes are disposed on a viewing side of the display.

21. The input device of claim 20, further comprising a processing system included a circuitry that configured to operate both at least one of the display and the plurality of the proximity sensor electrodes.

* * * * *